(12) United States Patent
Delano

(10) Patent No.: US 7,498,880 B2
(45) Date of Patent: Mar. 3, 2009

(54) CLASS L AMPLIFIER

(75) Inventor: Cary L. Delano, Los Altos, CA (US)

(73) Assignee: Leadis Technology, Inc., Sunnyvale, CA (US)

(*) Notice: Subject to any disclaimer, the term of this patent is extended or adjusted under 35 U.S.C. 154(b) by 58 days.

(21) Appl. No.: 11/688,833

(22) Filed: Mar. 20, 2007

(65) Prior Publication Data
US 2007/0236294 A1  Oct. 11, 2007

Related U.S. Application Data

(60) Provisional application No. 60/784,638, filed on Mar. 21, 2006.

(51) Int. Cl.
H03F 3/217 (2006.01)

(52) U.S. Cl. .................................................. 330/251

(58) Field of Classification Search ................. None
See application file for complete search history.

(56) References Cited

U.S. PATENT DOCUMENTS

| | | | |
|---|---|---|---|
| 4,030,045 A | 6/1977 | Clark | |
| 4,324,950 A | 4/1982 | Strickland | |
| 5,038,325 A | 8/1991 | Douglas et al. | |
| 5,072,171 A | 12/1991 | Eng | |
| 5,115,203 A | 5/1992 | Krett et al. | |
| 5,347,171 A | 9/1994 | Cordoba et al. | |
| 5,491,839 A | 2/1996 | Schotz | |
| 5,694,072 A | 12/1997 | Hsiao | |
| 6,107,886 A | 8/2000 | Kusakabe | |
| 6,215,356 B1 | 4/2001 | Servaes et al. | |
| 6,256,482 B1 | 7/2001 | Raab | |
| 6,304,138 B1 * | 10/2001 | Johnson | 330/69 |
| 6,323,729 B1 | 11/2001 | Sevenhans et al. | |
| 6,417,736 B1 | 7/2002 | Lewyn | |
| 6,486,733 B2 | 11/2002 | Myers et al. | |
| 6,504,426 B2 | 1/2003 | Picha et al. | |
| 6,538,514 B2 | 3/2003 | Harvey | |
| 6,614,310 B2 | 9/2003 | Quarfoot et al. | |
| 6,636,103 B2 | 10/2003 | Wurcer et al. | |
| 6,815,988 B2 | 11/2004 | Sanduleanu | |
| 6,838,942 B1 | 1/2005 | Somerville et al. | |
| 6,853,244 B2 | 2/2005 | Robinson et al. | |

(Continued)

FOREIGN PATENT DOCUMENTS

WO  WO 97/23005 A1  6/1997

(Continued)

OTHER PUBLICATIONS

International Search Report PCT/US07/064546.

(Continued)

*Primary Examiner*—Robert J. Pascal
*Assistant Examiner*—Krista M Flanagan
(74) *Attorney, Agent, or Firm*—Townsend and Townsend & Crew LLP; Kenneth R. Allen

(57) ABSTRACT

A new Class L amplifier which dynamically switches between multiple pairs of power rails, and has the ability to select the most advantageous combination of rails for the minimization of power dissipation in the amplifier. A bridged amplifier system using two Class L amplifiers to drive a load.

7 Claims, 10 Drawing Sheets

U.S. PATENT DOCUMENTS

| | | | |
|---|---|---|---|
| 6,975,175 B2 | 12/2005 | Sanduleanu | |
| 6,982,600 B2 | 1/2006 | Harvey | |
| 6,987,417 B2 | 1/2006 | Winter et al. | |
| 6,993,302 B2 * | 1/2006 | Bausov et al. | 455/127.1 |
| 6,998,914 B2 | 2/2006 | Robinson | |
| 7,026,868 B2 | 4/2006 | Robinson et al. | |
| 7,034,614 B2 | 4/2006 | Robinson et al. | |
| 7,042,284 B2 | 5/2006 | Moons et al. | |
| 7,043,213 B2 | 5/2006 | Robinson et al. | |
| 7,106,135 B2 | 9/2006 | Makino et al. | |

FOREIGN PATENT DOCUMENTS

| | | |
|---|---|---|
| WO | WO 00/00983 A1 | 1/2000 |

OTHER PUBLICATIONS

International Search Report PCT/US07/064549.
International Search Report PCT/US07/064548.
International Search Report PCT/US07/064545.
International Search Report PCT/US07/064543.
"TDA7563 Multifunction Quad Power Amplifier with Built-In Diagnostics Features", May 2003, ST Microelectronics.
"MAX9730 2.4W, Single-Supply, Class G Amplifier", Dec. 2006, Maxim Integrated Products.

* cited by examiner

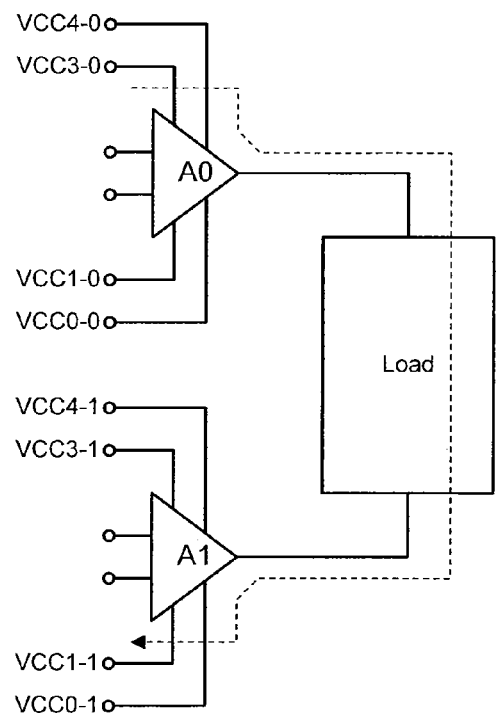
Fig. 1 – prior art
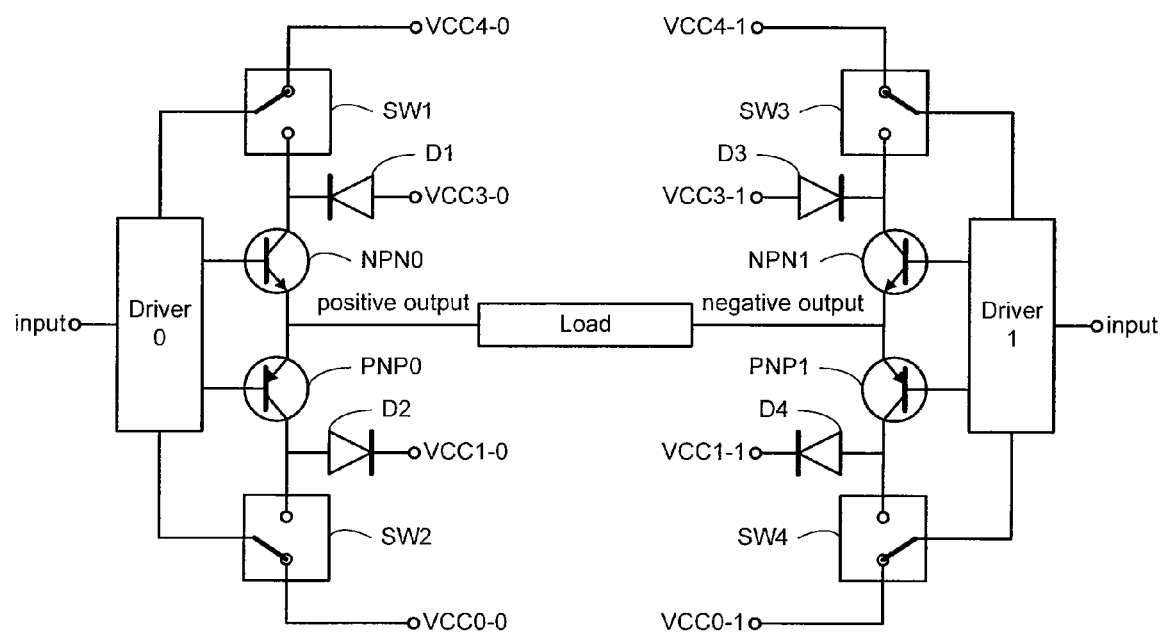
Fig. 2 – prior art

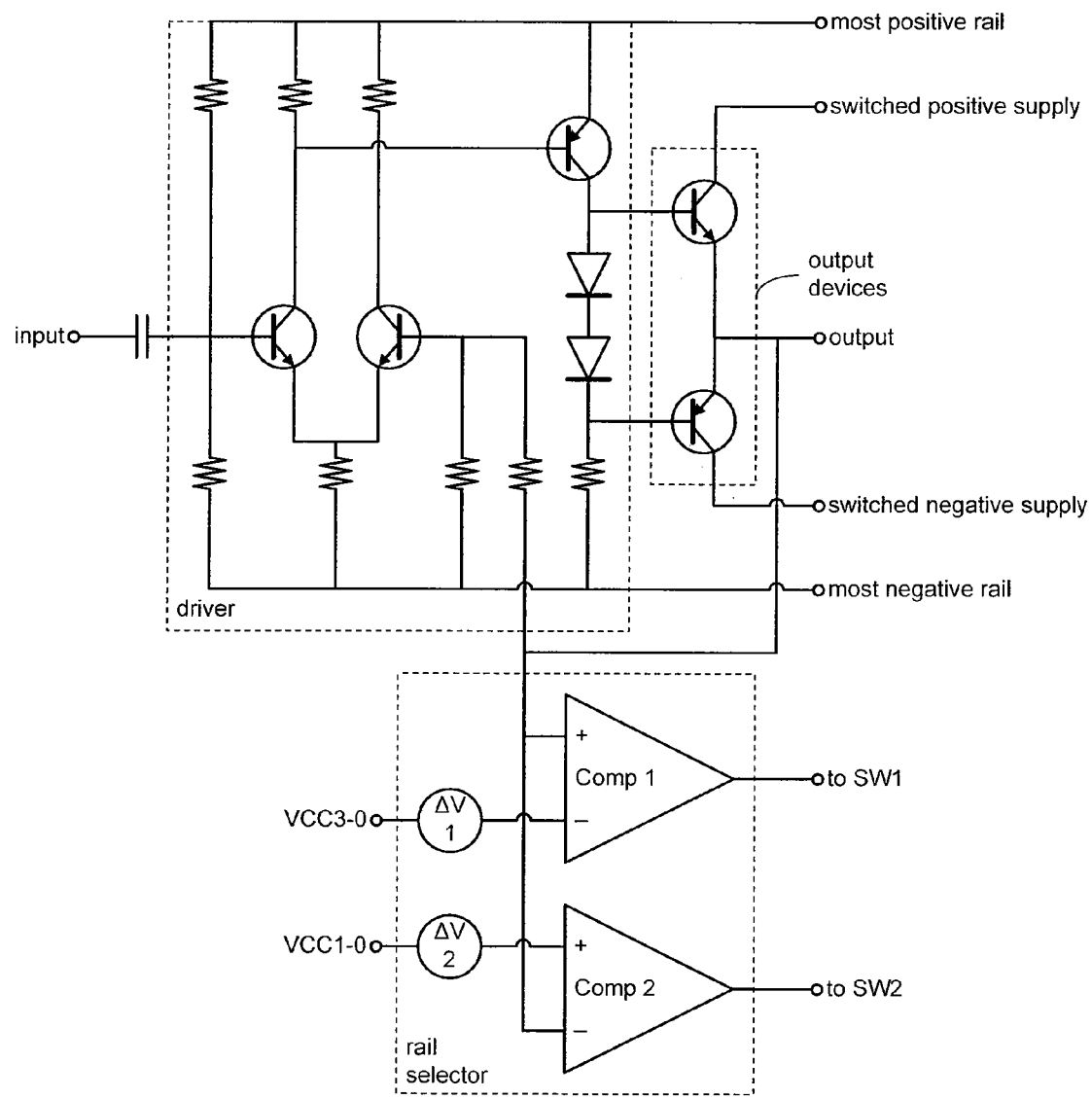
Fig. 3 – prior art

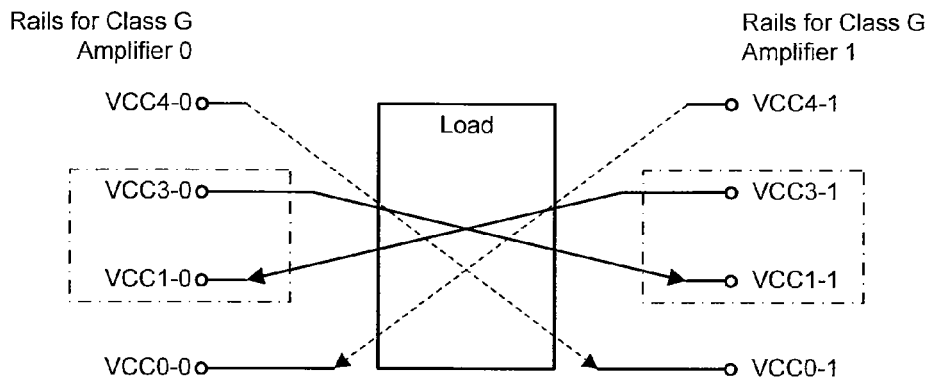
Fig. 4A – prior art – State 1
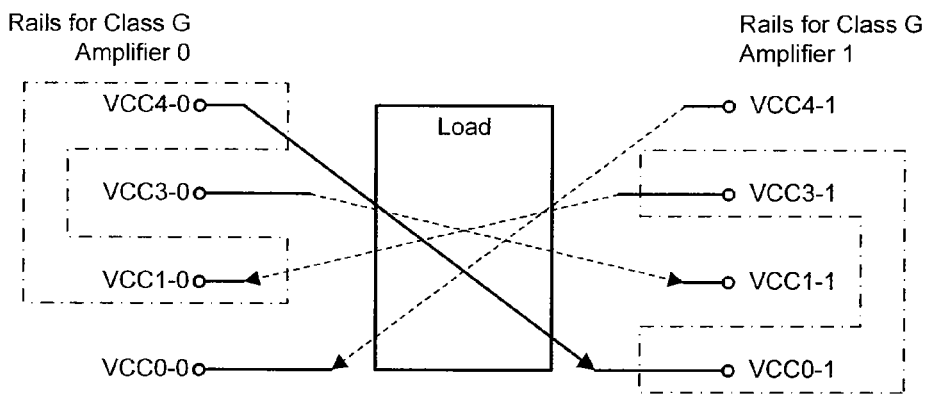
Fig. 4B – prior art – State 2
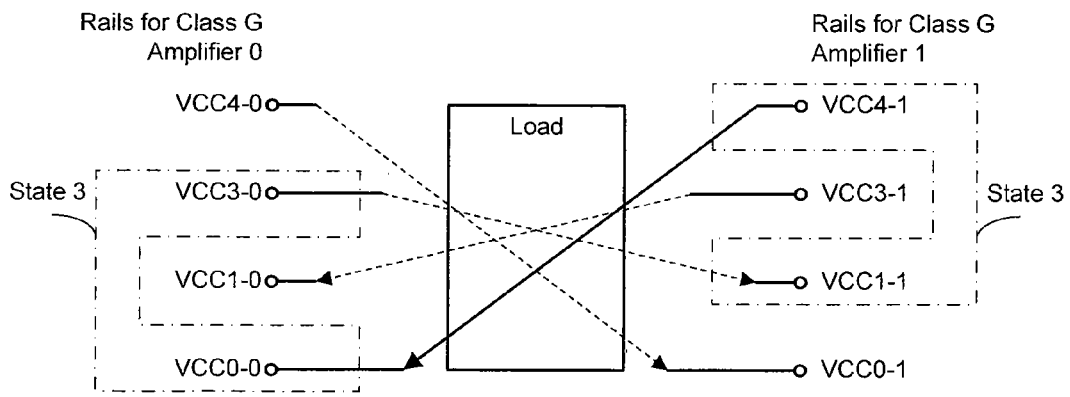
Fig. 4C – prior art – State 3

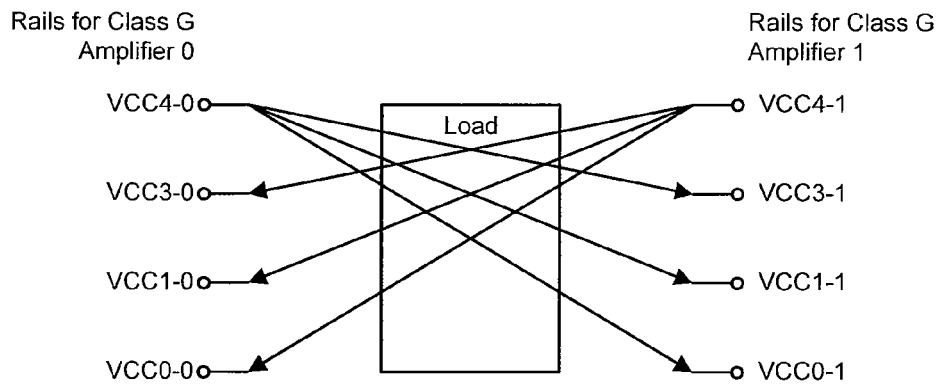
Fig. 5
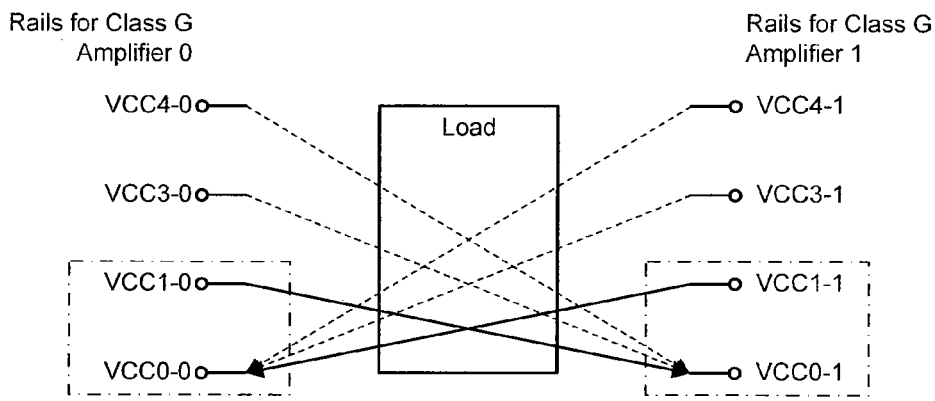
Fig. 6A – State 1
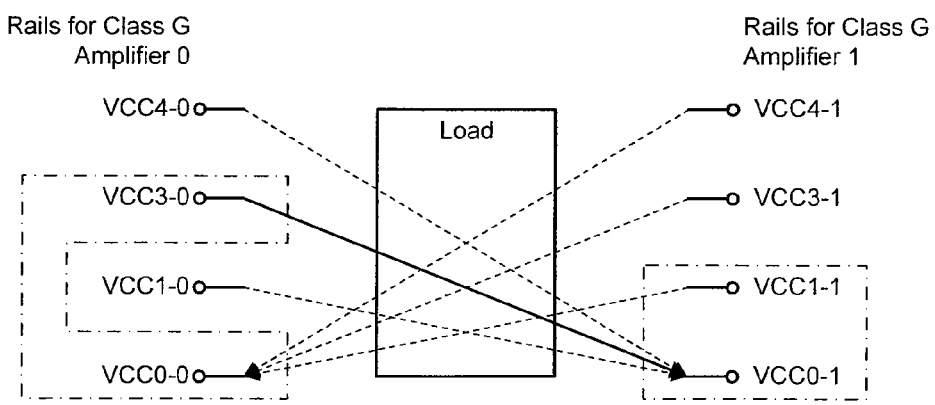
Fig. 6B – State 2

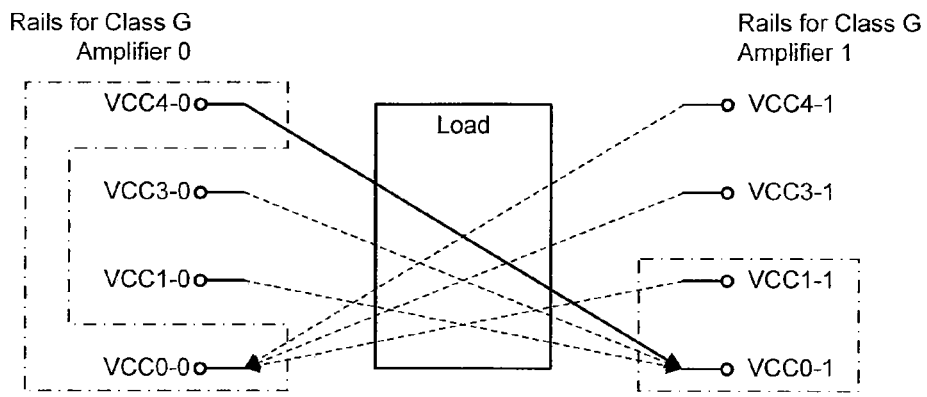
Fig. 6C – State 3
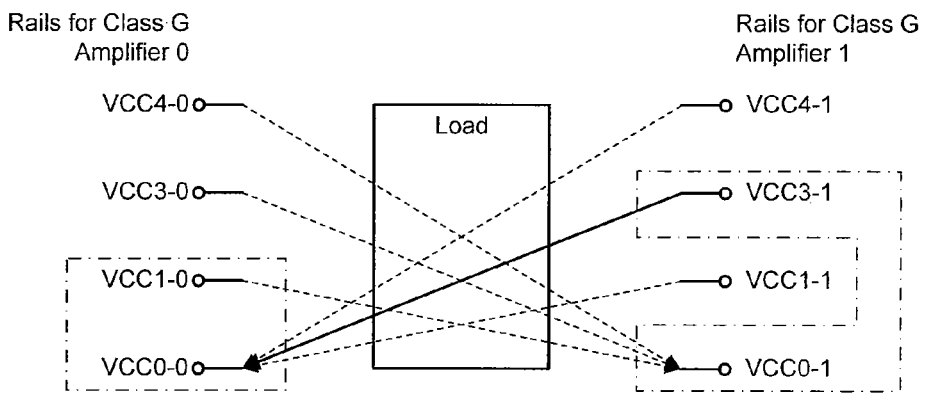
Fig. 6D – State 4
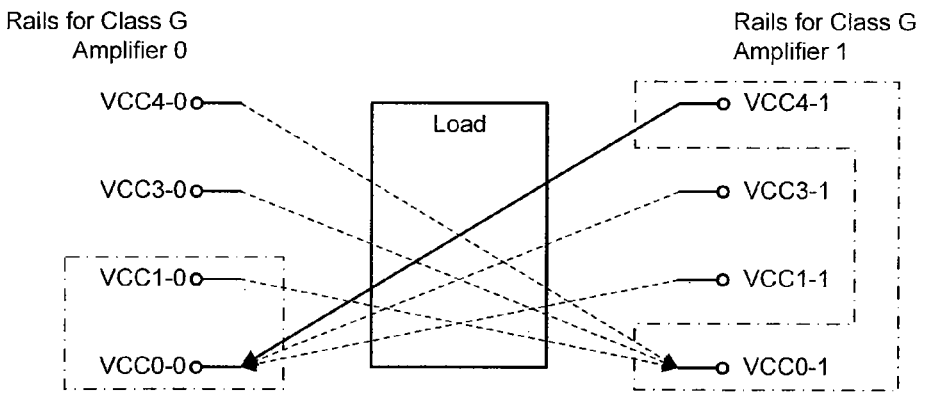
Fig. 6E – State 5

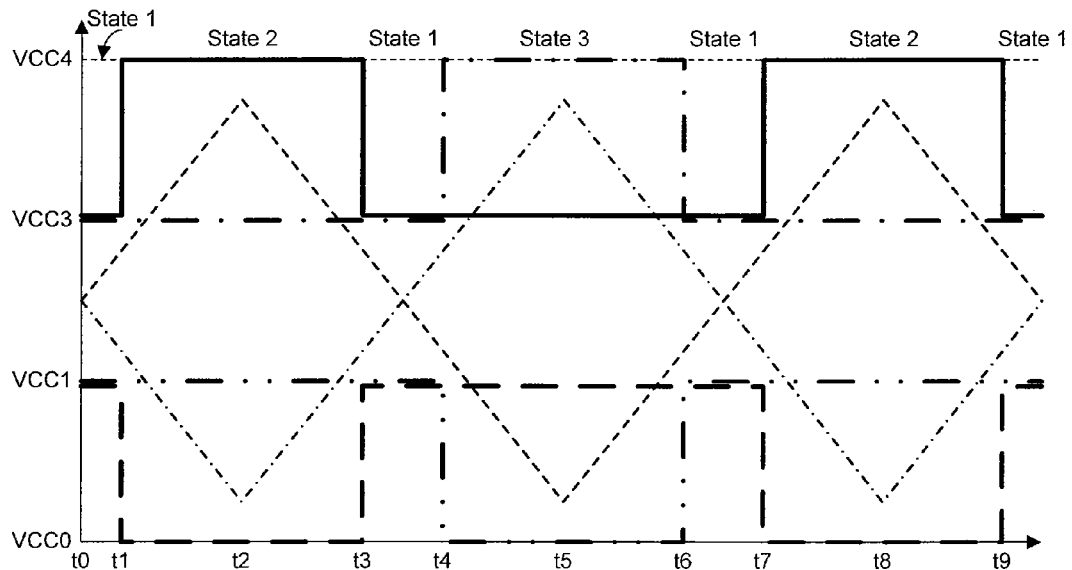
Fig. 11 – prior art
------ positive output
-·-·-· negative output
▬▬▬ positive side upper switched rail
▬·▬· negative side upper switched rail
▬ ·· ▬ positive side lower switched rail
▬ ▬ ▬ negative side lower switched rail
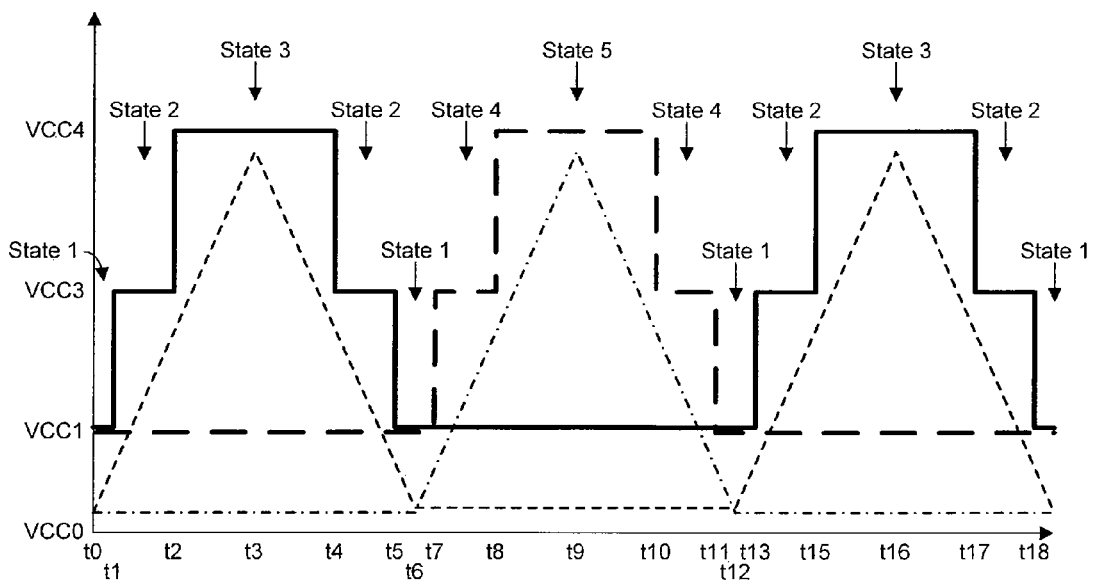
Fig. 12
------ positive output
-·-·-· negative output
▬▬▬ positive output switched rail
▬ ▬ ▬ negative output switched rail

CLASS L AMPLIFIER

RELATED APPLICATION

The present application claims benefit under 35 USC 119 (e) of U.S. provisional Application No. 60/784,638, filed on Mar. 21, 2006, entitled "Adaptive Biasing Based on Volume Control Setting," the content of which is incorporated herein by reference in its entirety.

BACKGROUND OF THE INVENTION

1. Technical Field of the Invention

This invention relates generally to electronic amplifiers, and more specifically to a differential (bridged) amplifier which has multiple power rails and uses an improved method of selecting rails to improve power efficiency.

2. Background Art

Class A and AB amplifiers are highly inefficient. Class D amplifiers are somewhat more efficient, but have a tradeoff of reduced linearity and increased cost. Class D amplifiers also suffer from high quiescent dissipation, which is the power dissipation when no input signal is present. Class D amplifiers also typically require an output low-pass filter, increasing component count and cost. Class A, AB, and D amplifiers use a single pair of power rails, typically referred to as VCC and VSS, or VCC and GND.

The ST Microelectronics TDA7563 is a car audio amplifier chip which uses two Class AB amplifiers to drive the ends of a bridged load. At any given time, only one of the two amplifiers is on, and the other is off. The on amplifier drives the full signal at one end of the load, and the off amplifier is simply switched to GND. As the output signal changes polarity, the two amplifiers alternate states. This cuts the power dissipation roughly in half, versus a conventional Class AB configuration.

Class G amplifiers are becoming a very good alternative to Class A, AB, and D amplifiers in some applications. Class G amplifiers use more than a single pair of power rails to improve efficiency. They rapidly switch between power rails, using the lowest power rail (for the output devices) that will accommodate the input signal at any given moment. Some use digital lookahead techniques to improve their switching performance. The theoretical maximum efficiency of a Class G amplifier increases as the number of power rails is increased, theoretically approaching 100% as the number of power rails approaches infinity. Unfortunately, increasing the number of power rails requires adding more power supply circuits and supply transition circuits, which increases system cost, complexity, and size. As a result, Class G amplifiers have been adopted in only a few markets.

In some applications, a load is driven by two bridged Class G amplifiers. In this configuration, both terminals of the load are driven in differential fashion. The load common mode is centered around a quiescent point which is normally the highest supply voltage (VCC) divided by two.

The principal goal in improving efficiency is to minimize the potential drop between any amplifier output terminal at any given instant in time and the power supply rail that is providing current to that output terminal. This reduces the P=VI dissipation experienced by the amplifier's output stage (s).

FIG. 1 illustrates an example of two bridged class G amplifiers (A0 and A1) driving a load. In this example, VCC4-0>VCC3-0>VCC1-0>VCC0-0 and VCC4-1>VCC3-1>VCC1-1>VCC0-1. In this example, the load is resistive and a signal is present that causes the load to be biased between supply voltage VCC3-0 and VCC1-1. The four power rails may be, for example: VCC0=0v, VCC1=1v, VCC3=3v, and VCC4=4v, but any other ascending set of values could be used instead. The term VCC2 is not used in this example, to avoid confusion with the 2v common mode point for the amplifiers. The -0 or -1 suffix on the power rails denotes whether the power rail is for the first amplifier A0 or the second amplifier A1.

In the example case of FIG. 1, the voltage across the load is less than VCC3-0 minus VCC1-1. The current that flows through the load in this example flows between supplies VCC3-0 and VCC1-1.

FIG. 2 illustrates another amplifier system according to the prior art. The amplifier system includes a first complementary pair NPN0, PNP0 and a second complementary pair NPN1, PNP1, each coupled to drive a load.

The collector of the NPN0 transistor is coupled to the VCC4-0 rail through a first switch SW1 and to the VCC3-0 rail through a first diode D1. The collector of the PNP0 transistor is coupled to the VCC0-0 rail through a second switch SW2 and to the VCC1-0 rail through a second diode D2. The collector of the NPN1 transistor is coupled to the VCC4-1 rail through a third switch SW3 and to the VCC3-1 rail through a third diode D3. The collector of the PNP1 transistor is coupled to the VCC1-0 rail through a fourth switch SW4 and to the VCC1-0 rail through a fourth diode D4.

First driver logic (Driver 0) receives an input signal, and provides gate signals to the first complementary pair based on the input signal. A second driver (Driver 1) receives an input signal, and provides gate signals to the second complementary pair based on the input signal. If the input signals are large enough that the outer rails must be used, the drivers activate their switches to couple the outer rails to the complementary pairs. The diodes prevent the inner rails from being shorted to the outer rails when the switches are activated. When the input signals are small enough that only the inner rails are needed, the drivers deactivate the switches, and the complementary pairs are powered by the inner rails (less a junction drop through the diodes).

FIG. 3 illustrates another amplifier system according to the prior art, such as may be used in implementing portions of FIG. 2. The amplifier system includes amplifier output devices, a driver, and a rail selector, each denoted by a dashed box.

The output devices include a complementary pair whose emitters drive the output node of the amplifier. The complementary pair's collectors are coupled to the switched positive supply and switched negative supply, respectively.

The rail selector includes a first comparator (Comp 1) which compares the signal at the output node to the VCC3-0 inner rail less a Delta V1 drop and generates the signal which closes the first switch (SW1 in FIG. 2). The rail selector includes a second comparator (Comp 2) which compares the signal at the output node to the VCC1-0 inner rail plus a Delta V2 drop and generates the signal which closes the second switch (SW2 in FIG. 2). Delta V1 and Delta V2 provide for adequate margin between the value of the output voltage and the VCC3 and VCC1 rails, respectively, to ensure the output voltage does not collide with the rails.

FIGS. 4A-C illustrate a more comprehensive set of the various current paths that may be used when two bridged Class G amplifiers (amplifier 0 and amplifier 1) are used to drive a load, as in FIG. 1. The current path shown in FIG. 1 in this case would be the same as the line from VCC3-0 to VCC1-1 in FIG. 1. A four-rail Class G amplifier can be thought of as though it were switching between two Class AB amplifiers—one tied from VCC3 to VCC1, and the other tied from VCC4 to VCC0, in the example shown.

There are four possible current paths in this example: VCC4-0 to VCC0-1, VCC3-0 to VCC1-1, VCC4-1 to VCC0-0, and VCC3-1 to VCC1-0. The combinations from VCC3 to VCC1 dissipate less power than the combinations from VCC4 to VCC0, but they can only accommodate signal swings of more limited amplitude. The bridged Class G amplifier will use the VCC3 to VCC1 combinations when the input signal is not swinging far from the VCC2 common mode point (specifically, the voltage across the load is less than VCC3 minus VCC1). When the input signal swings too far from VCC2 for the VCC3 to VCC1 combinations to provide adequate voltage, the amplifier will transition to using the VCC4 to VCC0 combinations.

The lowest power supply rail may be GND, if desired. Alternatively, the lower half of the rails may be negative, with the common mode point set at GND. Other settings can also be used, as is known.

During periods of small signal operation, the amplifier is able to use its inner rails, shown in FIG. 4A as "State 1". The positive side amplifier (Amplifier 0) uses rails VCC3-0 and VCC1-0, while the negative side amplifier (Amplifier 1) uses rails VCC3-1 and VCC1-1. The dashed boxes indicate the rails that are used. The solid lines through the load indicate the flow of current through the load. When a positive input signal is present, current flows from rail VCC3-0 through the load to rail VCC1-1, and when a negative input signal is present, current flows from rail VCC3-1 through the load to rail VCC1-0.

During periods of large signal operation, the amplifier cannot use its inner rails, and must shift to its outer rails, shown in FIG. 4B as "State 2" and "State 3". The positive side amplifier (Amplifier 0) uses rails VCC4-0 and VCC0-0, while the negative side amplifier (Amplifier 1) uses rails VCC4-1 and VCC0-1. When a positive input signal is present, current flows from rail VCC4-0 through the load to rail VCC0-1, and when a negative input signal is present, current flows from rail VCC4-1 through the load to rail VCC0-0.

FIG. 11 is a signal waveform graph illustrating the behavior of the positive side upper switched rail, the negative side upper switched rail, the positive side lower switched rail, and the negative side lower switched rail, as determined in response to the actual positive output and negative output signals by a prior art system such as that of FIGS. 2 and/or 3. In this example, the output signals constitute triangle or "sawtooth" waves. The rail suffixes -0 and -1 are omitted, in the interest of clarity; the reader should understand that when a positive switched rail is said to be at e.g. VCC3, that implies VCC3-0, and that when a negative switched rail is said to be at e.g. VCC3, that implies VCC3-1. The reader should ignore the tiny vertical offsets between the signals, e.g. between times t3 and t4; those are for illustration only, to make all the lines visible by avoiding overlap, and are not intended to represent any actual behavior of the circuitry.

At time t0, the positive and negative outputs are at the "zero crossing" point (often VCC/2 in many systems, or VCC4/2 in this example), and the positive side upper switched rail is at VCC3 and the negative side lower switched rail is at VCC1 (the inner rails). At time t1, the positive output has approached VCC3, so the positive side upper switched rail is switched to VCC4, and the negative output has approached VCC1, so the negative side lower switched rail is switched to VCC0. The positive side lower switched rail remains at VCC1, and the negative side upper switched rail remains at VCC3. At time t2, the triangle wave peaks. At time t3, the positive output has fallen sufficiently below VCC3, and the positive side upper switched rail is switched back to VCC3, and the negative output has risen sufficiently above VCC1, and the negative side lower switched rail is switched back to VCC1.

At time t4, the positive output has fallen sufficiently close to VCC1, and the positive side lower switched rail is switched to VCC0, and the negative output has risen sufficiently close to VCC3, and the negative side upper switched rail is switched to VCC4. At time t5, the triangle wave peaks. At time t6, the positive output has risen sufficiently above VCC1, and the positive side lower switched rail is switched back to VCC1, and the negative output has fallen sufficiently below VCC3, and the negative side upper switched rail is switched back to VCC3.

The cycle then continues as illustrated.

FIG. 11 also identifies periods when the amplifiers are operating in State 1, State 2, or State 3. It should be noted that multiple rails (in this case two at a time) switch simultaneously when entering or exiting either State 2 or State 3. When rail switching events are ganged in a manner such as this, the number of total rail combinations is relatively few, which limits one's options in the quest to maximize power efficiency.

The prior art system is only able to operate at the inner rails VCC3 and VCC1 between times t3 and t4, and t6 and t7. This does not offer significant power savings versus simply operating at VCC4 and VCC0 all the time, in the particular example shown, using a sawtooth wave and evenly spaced power rails.

What is needed is an improved Class G Type amplifier which uses an improved rail selection method to improve efficiency.

BRIEF DESCRIPTION OF THE DRAWING

FIG. 1 shows an example of bridged class G amplifiers and one possible current path, according to the prior art.

FIG. 2 shows another example of an amplifier system according to the prior art.

FIG. 3 shows yet another example of an amplifier system according to the prior art.

FIGS. 4A-C show possible power rail connections and current paths in a system using two bridged Class G amplifiers to drive a load, according to the prior art.

FIG. 5 shows one set of possible power rail connections and current paths in a system using two bridged Class L amplifiers to drive a load.

FIGS. 6A-E show another set of possible power rail combinations and current paths in a system using two bridged Class L amplifiers to drive a load.

FIG. 11 shows one example of signal waveforms such as may be produced by the prior art.

FIG. 12 shows another example of signal waveforms such as may be produced by this invention.

DETAILED DESCRIPTION

Figure 7:
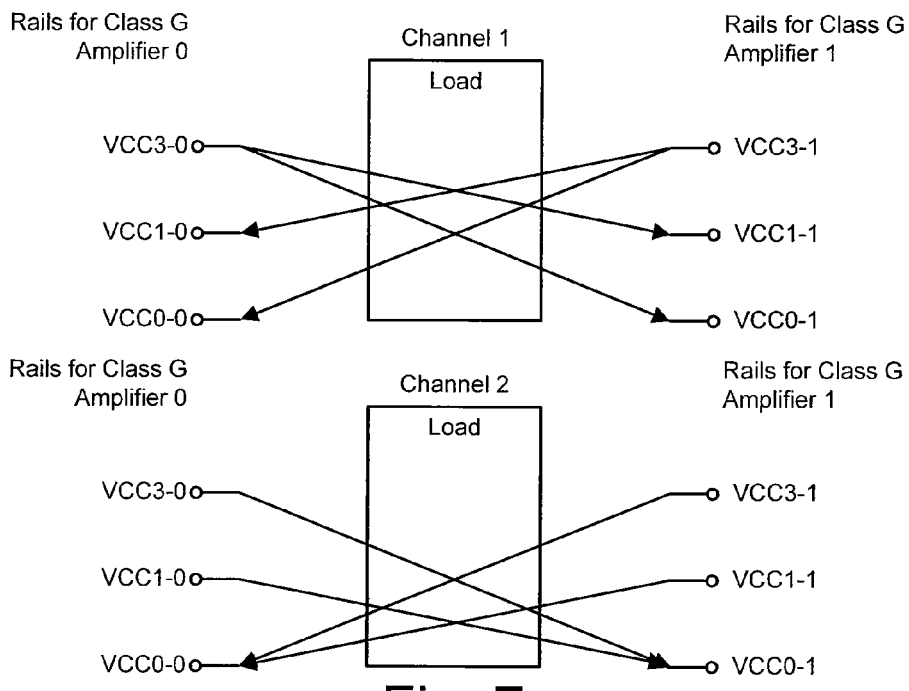
FIG. 7 shows another set of possible power rail combinations and current paths in a system using two bridged Class L amplifiers to drive a load.

The invention will be understood more fully from the detailed description given below and from the accompanying drawings of embodiments of the invention which, however, should not be taken to limit the invention to the specific embodiments described, but are for explanation and understanding only.

The amplifier system of this invention uses a power rail selection technique which is an improved versus that of Class G, to further improve efficiency. This is done by adjusting the common mode of the output signal in accordance with the real-time signal itself, such that the load is optimally positioned to use more rail combinations than in Class G. Because the load is being driven differentially, these dynamic changes in the common mode voltage produce no effect upon or response in the load. The switching between rails is done in a manner similar to that of Class G, in that it uses the smallest rail combination differential that is adequate to drive the load per the input signal at any given moment, with a consideration of the ability of each power supply to sink versus source current. The Class L system can be thought of as though it were using several Class AB amplifiers tied to the various current paths and alternating between them depending on the instantaneous magnitude of the output signal. In practice, this is usually done in the final stage of a two or more stage amplifier so the overall feedback loop can correct for any distortion produced by the transitions.

This invention allows additional current paths to be added, as shown, by adjusting the output common mode voltage to position the load between the newly selected rails. This adjusting of the common mode allows many more rail combinations to be utilized, and therefore increases efficiency. Techniques for adjusting the common mode of differential signals are well known, and a discussion of them is therefore not addressed here.

FIG. 5 illustrates the various current paths that may be used when two bridged Class L amplifiers (amplifier 0 and amplifier 1) are used to drive a load. There are six possible current paths in the example shown: VCC4-0 to VCC3-1, VCC4-0 to VCC1-1, VCC4-0 to VCC0-1, VCC4-1 to VCC3-0, VCC4-1 to VCC1-0, and VCC4-1 to VCC0-0. In this example, the common mode was adjusted so that the higher of the two voltage signals (the signal for Amplifier 0 or the signal for Amplifer1) was always near the top rail.

FIGS. 6A-E illustrate another set of various current paths that may be used when two bridged Class L amplifiers (amplifier 0 and amplifier 1) are used to drive a load. There are six possible current paths in this example: VCC4-0 to VCC0-1, VCC3-0 to VCC0-1, VCC1-0 to VCC0-1, VCC1-1 to VCC0-0, VCC3-1 to VCC0-0, and VCC4-1 to VCC0-0. In this example, the common mode was adjusted so that the lower of the two voltage signals (the signal for Amplifier 0 or the signal for Amplifer1) was always near the bottom rail.

During periods of small input signal operation, the amplifier is able to use its lowest rails, shown in FIG. 6A as "State 1". The positive side amplifier (Amplifier 0) uses rails VCC1-0 and VCC0-0, while the negative side amplifier (Amplifier 1) uses rails VCC1-1 and VCC0-1. The dashed boxes indicate the rails that are used. The solid lines through the load indicate the flow of current through the load. When a positive input signal is present, current flows from rail VCC1-0 through the load to rail VCC0-1, and when a negative input signal is present, current flows from rail VCC1-1 through the load to rail VCC0-0.

When the lowest rail combination is inadequate, the amplifier is able to use a next higher rail pair. And, unlike the prior art, it is able to do so independently in the two halves of the amplifier (positive and negative). FIGS. 6B and 6C show a next higher rail combination for each side. When a positive input signal is too large for the State 1 rail combination, the positive side amplifier (Amplifier 0) switches to State 2, in which it uses rails VCC3-0 and VCC0-0, and current flows from rail VCC3-0 through the load to rail VCC0-1. When a negative input signal is too large for the State 1 rail combination, the negative side amplifier (Amplifier 1) switches to State 4, in which it uses rails VCC3-1 and VCC0-1, and current flows from rail VCC3-1 through the load to rail VCC0-0.

FIGS. 6D and 6E shows a next higher rail combination for each side. When a positive input signal is too large for the State 2 rail combination, the positive side amplifier (Amplifier 0) switches to State 3, in which it uses rails VCC4-0 and VCC0-0, and current flows from rail VCC4-0 through the load to rail VCC0-1. When a negative input signal is too large for the State 4 rail combination, the negative side amplifier (Amplifier 1) switches to State 5, in which it uses rails VCC4-1 and VCC0-1, and current flows from rail VCC4-1 through the load to rail VCC0-0.

Such an amplifier is, of course, not limited to having only four rails per side. It could have as few as three, or many more than four. The two sides need not necessarily have the same number of rails, either. The number, spacing, and voltage levels of the rails on the two sides can be selected according to the needs of the application at hand. Advantageously, but not necessarily, they may be chosen so as to minimize power dissipation in the amplifier during amplification of an anticipated typical input signal or usage model.

One skilled in the art of amplifier design can easily adjust the designs in FIGS. 3 and 4 to use more or fewer rails.

In FIGS. 4, 5, and 6, there were two amplifiers together operating as a bridged amplifier. The concepts in FIGS. 5 and 6 can be extended by one skilled in the art to more than two amplifiers for use in applications like three-phased motor drivers.

In FIGS. 5 and 6, amplifier 0 and amplifier 1 operate as a bridged amplifier producing one differential output or "channel". More than one channel may be grouped together and operated from the same power supply circuitry. In this scenario, it can be advantageous if the channels are not operating in the same zones at the same time. For example, it is advantageous in a two-channel system to have one channel operate in the FIG. 5 mode and the other channel to operate in the FIG. 6 mode. This is because when the channels are in different zones there is less current required from some of the supplies.

FIG. 7 illustrates an example of a such a case, with three voltage supplies. For small differential output voltages, channel 1 operates between VCC3-0 to VCC1-1 or VCC3-1 to VCC1-0. During this time, the supply current for channel 1 comes from VCC3 to VCC1. At the same time, channel 2 for small signal is operating between VCC1-0 to VCC0-1 or VCC1-1 to VCC0-0. During this time, the supply current from channel 2 comes from VCC1 to VCC0. The net current required to be sinked/sourced from VCC1 is only the difference between the magnitudes of the 2 channels' supply currents which reduces the current requirements from VCC1. This can be particularly useful in audio where the left and right channels are usually strongly correlated.

In other embodiments, it is possible to hard switch one terminal of the bridge to a given rail and drive the other half of the bridge with the full signal when the differential output signal is, for example, positive, and doing the reverse when the signal is negative, instead of simply adjusting the common mode.

Another embodiment is particularly useful in high frequency applications. In these cases, the signal frequency is too high to switch between pairs of rails for every instance when the signal passes a rail. Therefore, an envelope signal is identified for the high frequency signal. This envelope is used to select rails. In these cases, both the positive and negative envelopes should be monitored when considering which power rails to use.

Lookahead techniques are often used in Class G amplifiers to more intelligently transition between rails, to reduce distortion caused by the transitions. These lookahead signals can be digital or analog in nature. Such techniques can optionally but advantageously also be used with the new Class L amplifiers of this invention.

This amplifier system may be used in a wide variety of applications, such as audio amplifiers, envelope generation signals for efficient RF amplification, DSL amplifiers, cable modem drivers, motor drivers, and may others. In some such applications, the load is transformer isolated; in such cases, the amplifier system of this invention can be used to drive a single ended output load by using the transformer as a balun.

Figure 8:
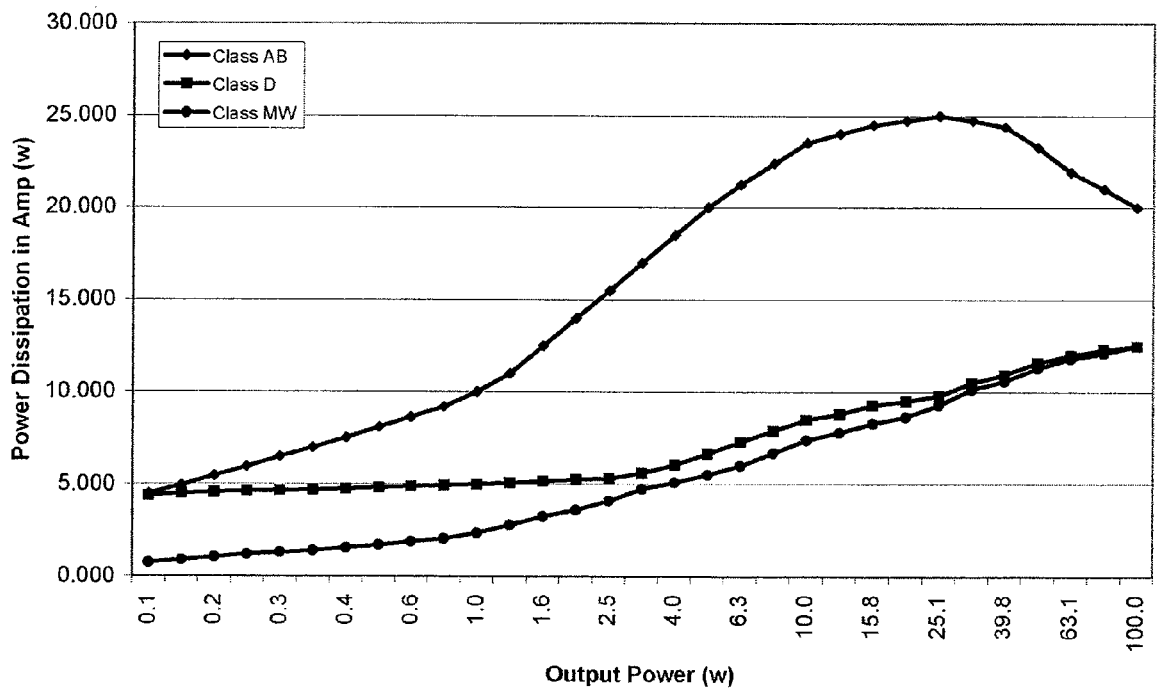
FIG. 8 shows a high level simulation of power dissipation in Class AB, Class D, and Class L amplifiers.
Figure 8:
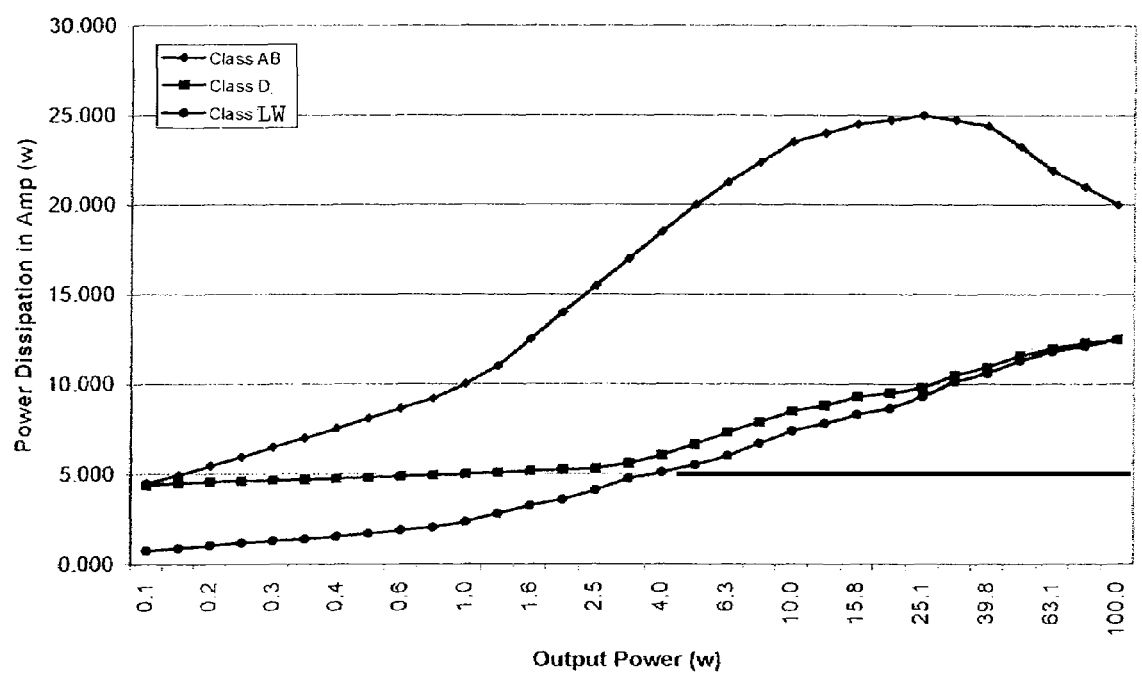

FIG. 8 is a chart illustrating the results of high level simulation of power dissipation of a car radio amplifier using Class AB, Class D, and Class L amplifiers. The Class L amplifier was simulated as having five power rails (versus only four shown in FIG. 3). Typical inefficiencies in the DC-DC converters that would be used to supply the power rails were included in the simulation. The input signal applied was a Gaussian noise signal whose standard deviation was increased at each simulation point as a means of increasing power on the X-axis. Not all effects are perfectly modeled in the simulation, of course, but it is very clear that the new Class L amplifiers are more efficient than Class D or Class AB amplifiers. In particular, the quiescent power and power dissipation for small signals are greatly improved (reduced).

In some embodiments such as discussed in FIGS. 3 and 4, the power rails are evenly (linearly) spaced, producing evenly spaced "zones". For example, VCC4 may be 3v, VCC3 may be 2v, VCC1 may be 1v, and VCC0 may be GND. This yields six distinct possible configurations, and the six cases from FIGS. 5 and 6 are given in Table 1:

be very small most of the time and only occasionally become large. In these cases it can save average power dissipation to have an abundance of small zones.

In other embodiments, the rail voltages are non-linearly spaced, in order to produce more rail combinations. For example VCC4 may be 5v, VCC3 may be 4v, VCC1 may be 2v, and VCC0 may be GND. This yields 10 rail combinations, given in Table 2:

TABLE 2

Unevenly Spaced Power Rails

| | Amp0 to Amp1 Rails | Amp1 to Amp0 Rails | Differential Output Voltage "Zone" (Amp0 minus Amp1) | Vcm |
|---|---|---|---|---|
| 1 | VCC4-VCC0 | | 5 v | 2.5 v |
| 2 | VCC3-VCC0 | | 4 v | 2.0 v |
| 3 | VCC4-VCC1 | | 3 v | 3.5 v |
| 4 | VCC3-VCC1 or VCC1-VCC0 | | 2 v | 3.0 v or 1.0 v |
| 5 | VCC4-VCC3 | | 1 v | 1.0 v |
| 6 | | VCC4-VCC3 | −1 v | 4.5 v |
| 7 | | VCC3-VCC1 or VCC1-VCC0 | −2 v | 4.5 v or 1.0 v |
| 8 | | VCC4-VCC1 | −3 v | 3.5 v |
| 9 | | VCC3-VCC0 | −4 v | 2.0 v |
| 10 | | VCC4-VCC0 | −5 v | 2.5 v |

In Table 2, Vcm is the common mode voltage, which is midway between the two power rails of that zone; note that some zones can be achieved by more than one rail pair, and thus may have more than one Vcm listed.

It can be seen from this example that the new art, in taking advantage of the extra rails produced, abruptly changes the common mode of the bridged output signal. This occurred in Table 2 many times such as was required to change from the

TABLE 1

Evenly Spaced Power Rails

| | Amp0 to Amp1 Rails | Amp1 to Amp0 Rails | Total Possible Differential Output Voltage "Zones" (Amp0 minus Amp1) |
|---|---|---|---|
| 1 | VCC4 to VCC0 | | 3 v |
| 2 | VCC4 to VCC1 or VCC3 to VCC0 | | 2 v |
| 3 | VCC1 to VCC0 | | 1 v |
| 4 | | VCC1 to VCC0 | −1 v |
| 5 | | VCC4 to VCC1 or VCC3 to VCC0 | −2 v |
| 6 | | VCC4 to VCC0 | −3 v |

In other embodiments, the zones are unevenly spaced. Uneven zone spacing can improve efficiency by optimizing the zones for a particular application. For example, a particular system may be designed and used such that it will spend virtually all of the time amplifying an input signal that is known to oscillate in a predetermined, narrow amplitude range, only very occasionally venturing outside that range. In such a case, the power rails may be selected to provide the best possible efficiency within the range where the amplifier will spend the vast majority of its time, with the tradeoff that efficiency may be very poor during the rare occasions where the amplifier is asked to step outside that range. Another system where unevenly spaced zones are useful is where the signal's probability density function provides for the signal to VCC4-VCC1 zone to the VCC3-VCC0 zone. The differential signal (which is the only signal of consequence to the load), however, accurately follows the input signal in the bandwidth of interest which is usually achieved by differential feedback.

Other unequally spaced rail combinations with different jumps in the output common mode are possible (some steps do not require common mode jumps). The example in Table 2 produced a net set of evenly spaced zones but it is possible to select the zones to produce uneven zone spacings.

Figure 9:
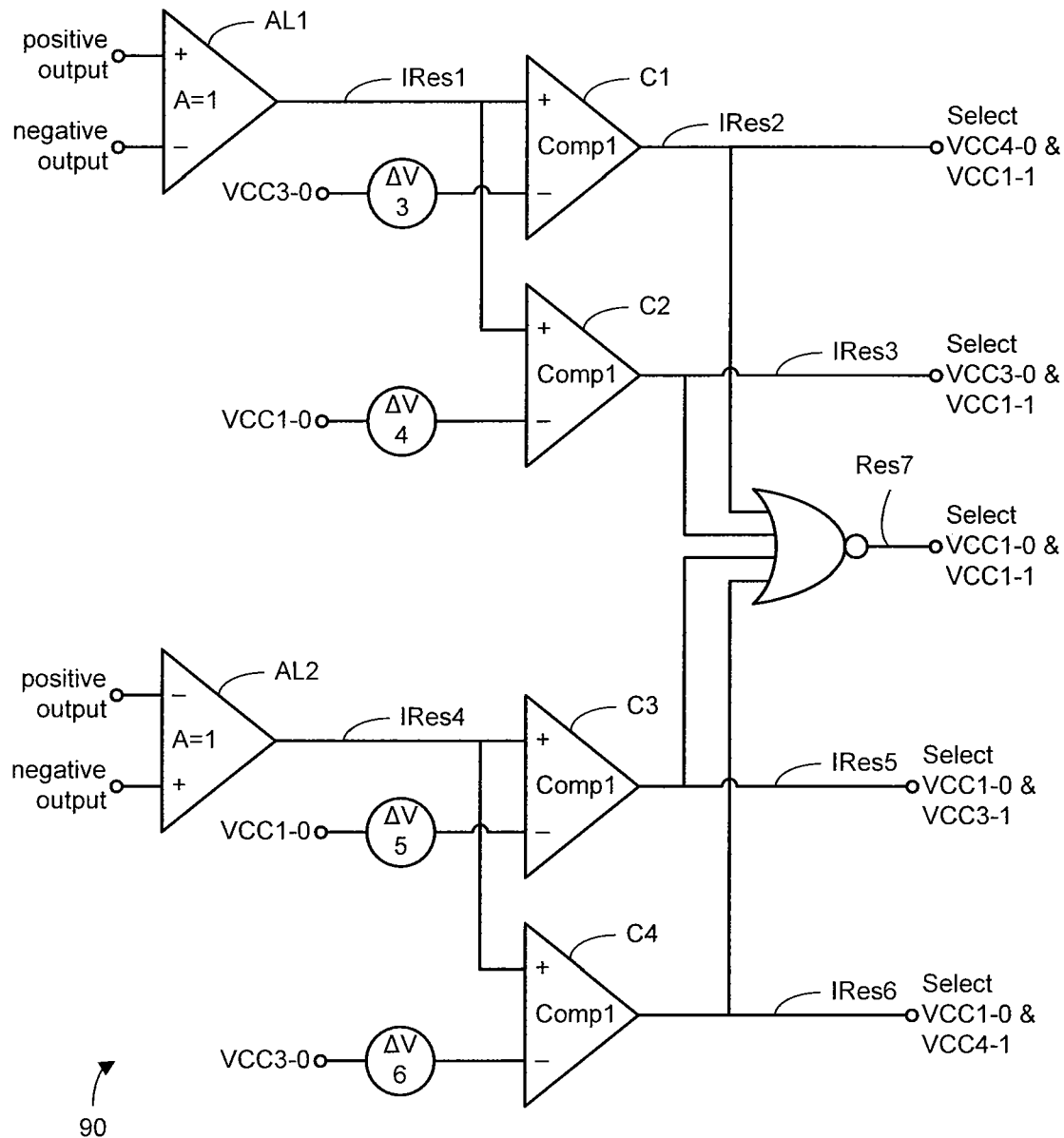
FIG. 9 shows a rail selector according to one embodiment of this invention.

FIG. 9 illustrates one embodiment of a rail selector 90 such as may be used in practicing this invention. The rail selector includes a first amplifier AL1 which converts the positive and negative outputs of the amplifier stage (not shown) to a single-ended signal and generates a first intermediate result signal IRes1. A first comparator C1 compares the first intermediate result signal to the VCC3-0 positive upper inner rail (less a Delta V3 drop) and generates a second intermediate result signal IRes2 which selects the VCC4-0 and VCC1-1 rails for the amplifier. A second comparator C2 compares the first intermediate result signal to the VCC1-0 positive lower inner rail (less a Delta V 4 drop) and generates a third intermediate result signal IRes3 which selects the VCC3-0 and VCC1-1 rails for the amplifier.

The rail selector includes a second amplifier AL2 which converts the positive and negative outputs of the amplifier into a single-ended signal and generates a fourth intermediate result signal IRes4. A third comparator C3 compares the fourth intermediate result signal to the VCC1-0 negative lower inner rail (less a Delta V5 drop) and generates a fifth intermediate result signal IRes5 which selects the VCC1-0 and VCC3-1 rails for the amplifier. A fourth comparator C4 compares the fourth intermediate result signal to the VCC3-0 negative upper inner rail (less a Delta V6 drop) and generates a sixth intermediate result signal IRes6 which selects the VCC1-0 and VCC4-1 rails for the amplifier.

A NOR gate receives the second, third, fifth, and sixth intermediate result signals and, if none of them is active, produces a result signal Res7 which selects the VCC1-0 and VCC1-1 rails for the amplifier.

Figure 10:
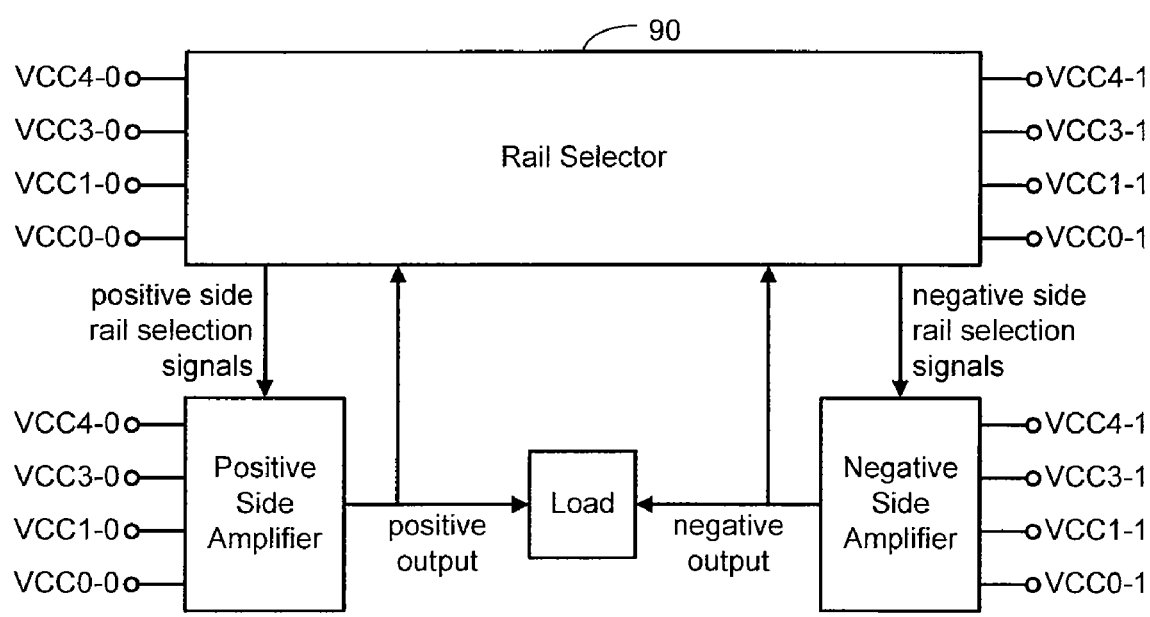
FIG. 10 shows an amplifier system according to one embodiment of this invention, using the rail selector of FIG. 9

FIG. 10 illustrates an amplifier system according to one embodiment of this invention. The system includes a load powered by a positive output signal from a positive side amplifier and by a negative output signal from a negative side amplifier. A rail selector, such as the rail selector 90 of FIG. 9, receives at least the positive inner rails VCC3-0 and VCC1-0 and the negative inner rails VCC3-1 and VCC1-1, and may also receive the positive outer rails VCC4-0 and VCC0-0 and the negative outer rails VCC4-1 and VCC0-1. The rail selector also receives the positive and negative output signals. The rail selector provides one or more positive side rail selection signals and one or more negative side rail selection signals, which activate switches (not shown) in the drivers (not shown, or shown as integrated within the amplifiers).

FIG. 12 is a signal waveform illustrating operation of the present invention, particularly showing the behavior of the positive output switched rail and the negative output switched rail in response to a triangle wave in accordance with the rail selector of FIG. 9. Again, the reader should ignore the tiny vertical offsets which are to prevent overlap and make all lines visible.

At time t0, the positive output is rising, and the positive output switched rail is at VCC1. At time t1, the positive output has approached sufficiently close to VCC1, and the positive output switched rail is switched to VCC3. At time t2, the positive output has approached VCC3, and the positive output switched rail is switched to VCC4. At time t3, the triangle wave peaks. The negative output signal remains at VCC0, and the negative output switched rail remains at VCC1. At time t4, the positive output has fallen sufficiently below VCC3, and the positive output switched rail is switched back to VCC3. At time t5, the positive output has fallen sufficiently below VCC1, and the positive output switched rail is switched back to VCC1.

Time t6 represents the "zero crossing", and the positive output goes to VCC0, and the negative output begins to rise toward VCC1. Note that VCC4 is more negative than VCC0, on the negative amplifier side, so "rise" of a negative signal on the graph really means "drop" in real world differential voltage. At time t7, the negative output has sufficiently approached VCC1, so the negative output switched rail is switched to VCC3. At time t8, the negative output has approached VCC3, so the negative output switched rail is switched to VCC4. At time t9, the triangle wave peaks. At time t10, the negative output has fallen sufficiently below VCC3, and the negative output switched rail is switched back to VCC3. At time t11, the negative output has fallen sufficiently below VCC1, and the negative output switched rail is switched back to VCC1. At time t12, the "zero crossing" is hit again, and the cycle repeats as illustrated.

Compared to the prior art, the present invention has a greatly improved ability to spend time at rail combinations in which the voltage difference between the selected rails and the amplifier output terminals to which each is supplying current is minimized, yielding significantly improved power savings versus that obtained by the prior art. For example, from time t5 to t7, the lowest combination of rails is used. And from time t4 to t5, and time t7 to t8, an intermediate rail combination is used.

As can be seen from FIGS. 6 and 12, the present invention offers power saving opportunities over the prior art in several different ways, such as: independent rail selection in the positive and negative sides of the amplifier; more than two rail combinations in each of the positive and negative sides of the amplifier; and the possibility to use those opportunities separately or in combination.

CONCLUSION

When one component is said to be "adjacent" another component, it should not be interpreted to mean that there is absolutely nothing between the two components, only that they are in the order indicated.

The various features illustrated in the figures may be combined in many ways, and should not be interpreted as though limited to the specific embodiments in which they were explained and shown.

Those skilled in the art, having the benefit of this disclosure, will appreciate that many other variations from the foregoing description and drawings may be made within the scope of the present invention. Indeed, the invention is not limited to the details described above. Rather, it is the following claims including any amendments thereto that define the scope of the invention.

What is claimed is:

1. An amplifier system comprising:
   a first amplifier device coupled to receive an input signal and provide a first output signal; and
   a first rail selector coupled to the first amplifier device, for coupling the first amplifier device to a first power rail and a second power rail in response to the output signal being lower than a first threshold, to couple the first amplifier device to a third power rail and the first power rail in response to the input signal being higher than the first threshold and lower than a second threshold, and to couple the first amplifier device to a fourth power rail and the first power rail in response to the input signal being higher than the second threshold;
   a second amplifier device coupled to receive an input signal and provide a second output signal; and
   a second rail selector coupled to the second amplifier device, for coupling the second amplifier device to a fifth power rail and a sixth power rail in response to the output signal being lower than a third threshold, to couple the second amplifier device to a seventh power rail and the fifth power rail in response to the input signal being higher than the third threshold and lower than a fourth threshold, and to couple the second amplifier device to an eighth power rail and the fifth power rail in response to the input signal being higher than the fourth threshold;

wherein the first rail selector comprises:

a third amplifier device coupled to receive the first and second output signals and, responsive thereto, to generate a first intermediate result signal;

a first comparator coupled to receive the first intermediate result signal and the third power rail and, responsive thereto, to generate a second intermediate result signal;

a second comparator coupled to receive the first intermediate result signal and the second power rail and, responsive thereto, to generate a third intermediate result signal;

a fourth amplifier device coupled to receive the first and second output signals and, responsive thereto, to generate a fourth intermediate result signal;

a third comparator coupled to receive the fourth intermediate result signal and the sixth power rail and, responsive thereto, to generate a fifth intermediate result signal;

a fourth comparator coupled to receive the fourth intermediate result signal and the seventh power rail and, responsive thereto, to generate a sixth intermediate result signal;

a NOR device coupled to receive the second, third, fifth, and sixth intermediate result signals and, responsive thereto, to generate a seventh result signal;

wherein, the second intermediate result signal selects the fourth and first power rails for the first amplifier device and the sixth and fifth power rails for the second amplifier device, the third intermediate result signal selects the third and first power rails for the first amplifier device and the sixth and fifth power rails for the second amplifier device, the fifth intermediate result signal selects the second and first power rails for the first amplifier device and the seventh and fifth power rails for the second amplifier device, the sixth intermediate result signal selects the second and first power rails for the first amplifier device and the eighth and fifth power rails for the second amplifier device, and the seventh result signal selects the second and first power rails for the first amplifier device and the sixth and fifth power rails for the second amplifier device.

2. The amplifier system of claim 1 wherein:

the first input signal comprises a positive input signal;

the first amplifier device comprises a positive amplifier device;

the second input signal comprises a negative input signal; and the second amplifier device comprises a negative amplifier device.

3. The amplifier system of claim 1 wherein:

the first rail selector is adapted to couple the first amplifier device to M possible rail combinations; and the second rail selector is adapted to couple the second amplifier device to N possible rail combinations;

wherein M and N are positive integers and N is greater than one.

4. The amplifier system of claim 1 wherein:

the first, second, third, and fourth power rails comprise substantially equally spaced positive voltages.

5. The amplifier system of claim 1 wherein:

the first, second, third, and fourth power rails are configured such that the fourth is larger than the third, the third is larger than the second, and the second is larger than the first;

the fifth, sixth, seventh, and eighth power rails are configured such that the eighth is larger than the seventh, the seventh is larger than the sixth, and the sixth is larger than the fifth.

6. The amplifier system of claim 5 wherein:

the first and fifth power rails comprise ground.

7. The amplifier system of claim 5 wherein:

the first, second, third, and fourth power rails comprise substantially equally spaced voltages; and the fifth, sixth, seventh, and eighth power rails comprise substantially equally spaced voltages.

* * * * *